United States Patent
Studnicka et al.

(10) Patent No.: US 12,348,123 B2
(45) Date of Patent: Jul. 1, 2025

(54) DC-DC CONVERTER CIRCUIT

(71) Applicant: HONEYWELL INTERNATIONAL INC., Charlotte, NC (US)

(72) Inventors: Pavel Studnicka, Brno (CZ); Petr Spanel, Brno (CZ); Ondrej Kotaba, Brno (CZ); Jiri Holy, Brno (CZ)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 270 days.

(21) Appl. No.: 18/300,735

(22) Filed: Apr. 14, 2023

(65) Prior Publication Data

US 2024/0348169 A1 Oct. 17, 2024

(51) Int. Cl.
*H02M 1/08* (2006.01)
*H02M 1/00* (2007.01)
*H03K 17/691* (2006.01)
*H02M 3/155* (2006.01)
*H02M 3/335* (2006.01)

(52) U.S. Cl.
CPC ........... *H02M 1/08* (2013.01); *H02M 1/0006* (2021.05); *H03K 17/691* (2013.01); *H02M 3/155* (2013.01); *H02M 3/335* (2013.01); *H03K 2217/0063* (2013.01); *H03K 2217/0072* (2013.01)

(58) Field of Classification Search
CPC ...... H02M 1/0006; H02M 1/08; H02M 3/155; H02M 3/335; H03K 17/691; H03K 2217/0063; H03K 2217/0072
See application file for complete search history.

(56) References Cited

U.S. PATENT DOCUMENTS

| | | | |
|---|---|---|---|
| 11,264,985 B1* | 3/2022 | Ryan | H03K 17/691 |
| 11,575,305 B2* | 2/2023 | May | H02M 1/08 |
| 2014/0268894 A1 | 9/2014 | Shinohara et al. | |
| 2018/0019684 A1 | 1/2018 | Yamashita et al. | |
| 2022/0311433 A1* | 9/2022 | Miatton | H03K 17/691 |

FOREIGN PATENT DOCUMENTS

| | | |
|---|---|---|
| CN | 201409088 Y | 2/2010 |
| CN | 110829848 A | 2/2020 |
| EP | 3386053 A1 | 10/2018 |
| JP | 2005051991 A | 2/2005 |

* cited by examiner

*Primary Examiner* — Jue Zhang
(74) *Attorney, Agent, or Firm* — Lorenz & Kopf LLP

(57) ABSTRACT

A DC-DC converter circuit includes a high-side transistor, a low side transistor, a gate driver power supply, a converter control, and a capacitance divider network. The high-side transistor includes a high-side drain terminal, a high-side source terminal, and a high-side gate terminal. The high-side drain terminal is coupled to a positive DC supply terminal. The gate driver power supply is electrically isolated from the high-side transistor and the low-side transistor. The converter control is configured to supply high-side control commands and low-side control commands to the high-side transistor and the low-side transistor, respectively. The capacitance divider network includes a first capacitor and a second capacitor. The first capacitor is electrically connected in series, at a DC-link midpoint node, to the second capacitor. The DC-link midpoint node, the gate driver power supply, and the converter control are all electrically connected to, and share, a local electrical ground.

20 Claims, 2 Drawing Sheets

DC-DC CONVERTER CIRCUIT

TECHNICAL FIELD

The present disclosures generally relates to high-voltage power electronic circuits, and more particularly to a high-voltage DC-DC converter circuit.

BACKGROUND

Designing high-voltage (e.g., ≥300 VDC) power electronic circuits, such as high-voltage DC-DC converters, for operation in reduced pressure environments, such as in-flight aircraft, can present various challenges. One particular challenge is associated with the onset of corona and partial discharge sensitivity of many system components. Many electronic components used in high-voltage power electronic circuits are typically tested by manufacturers only at ground atmospheric pressure conditions. Thus, significant derating and qualification effort is needed when these circuits are used a reduced pressure environment.

One particularly challenging component in many high-voltage DC-DC converters implemented with switching topologies is the pulse transformer. Typically, relatively large and expensive custom transformers with non-traditional winding arrangements are used. Although these transformers, and various other components, are generally safe, reliable, and robust, they do present certain drawbacks. For example, their use increases printed circuit board (PCB) size and drives the unit cost and supply chain requirements due to non-standard design.

Hence, there is a need for a high-voltage DC-DC converter circuit that does not increase PCB size and/or does not increase unit cost and/or does not impart supply chain issues. The present disclosure addresses at least these needs.

BRIEF SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter.

In one embodiment, a DC-DC converter circuit includes a high-side transistor, a low side transistor, a gate driver power supply, a converter control, and a capacitance divider network. The high-side transistor includes a high-side drain terminal, a high-side source terminal, and a high-side gate terminal. The high-side drain terminal is coupled to a positive DC supply terminal. The low-side transistor includes a low-side drain terminal, a low-side source terminal, and a low-side gate terminal. The low-side drain terminal is coupled to the high-side source terminal, and the low-side source terminal is coupled to a negative DC supply terminal. The gate driver power supply is electrically isolated from the high-side transistor and the low-side transistor. The converter control is configured to supply high-side control commands and low-side control commands to the high-side transistor and the low-side transistor, respectively. The capacitance divider network includes a first capacitor and a second capacitor. The first capacitor is electrically connected in series, at a DC-link midpoint node, to the second capacitor. The first capacitor is also electrically connected to the positive DC supply terminal, and the second capacitor is electrically connected to the negative DC supply terminal. The DC-link midpoint node, the gate driver power supply, and the converter control are all electrically connected to, and share, a local electrical ground.

In another embodiment, a DC-DC converter circuit includes a high-side transistor, a low-side transistor, a gate driver power supply, a high-side gate driver, a low-side gate driver, a converter control, a capacitance divider network, and first and second balancing resistors. The high-side transistor includes a high-side drain terminal, a high-side source terminal, and a high-side gate terminal. The high-side drain terminal is coupled to a positive DC supply terminal. The low-side transistor includes a low-side drain terminal, a low-side source terminal, and a low-side gate terminal. The low-side drain terminal is coupled to the high-side source terminal, and the low-side source terminal is coupled to a negative DC supply terminal. The gate driver power supply is electrically isolated from the high-side transistor and the low-side transistor. The high-side gate driver is coupled to the high-side gate terminal and is responsive to high-side control commands to cause the conductivity of the high-side transistor to vary. The low-side gate driver is coupled to the low-side gate terminal and is responsive to low-side commands to cause the conductivity of the low-side transistor to vary. The converter control is configured to supply the high-side control commands and the low-side control commands to the high-side gate driver and the low-side gate driver, respectively. The capacitance divider network includes a first capacitor and a second capacitor. The first capacitor is electrically connected in series, at a DC-link midpoint node, to the second capacitor. The first capacitor is also electrically connected to the positive DC supply terminal, and the second capacitor is electrically connected to the negative DC supply terminal. The first balancing resistor is electrically connected in series, at the DC-link midpoint node, to the second balancing resistor. The first balancing resistor is also electrically connected to the positive DC supply terminal, and the second balancing resistor is electrically connected to the negative DC supply terminal. The DC-link midpoint node, the gate driver power supply, and the converter control are all electrically connected to, and share, a local electrical ground.

In yet another embodiment, a DC-DC converter circuit includes a high-side transistor, a low-side transistor, a gate driver power supply, an isolation transformer, a high-side gate driver, a low-side gate driver, a converter control, a capacitance divider network, and first and second balancing resistors. The high-side transistor includes a high-side drain terminal, a high-side source terminal, and a high-side gate terminal. The high-side drain terminal is coupled to a positive DC supply terminal. The low-side transistor includes a low-side drain terminal, a low-side source terminal, and a low-side gate terminal. The low-side drain terminal is coupled to the high-side source terminal, and the low-side source terminal is coupled to a negative DC supply terminal. The isolation transformer is coupled between the gate driver power supply and each of the high-side and low-side transistors and includes a high-side isolation transformer and a low-side isolation transformer. The high-side isolation transformer has a primary winding and a secondary winding, and the secondary winding of the high-side isolation transformer is coupled to the high-side gate driver. The low-side isolation transformer has a primary winding and a secondary winding, and the secondary winding of the low-side isolation transformer coupled to the low-side gate driver. The high-side gate driver is coupled to the high-side gate terminal and is responsive to high-side control commands to cause the conductivity of the high-side transistor to vary. The low-side gate driver is coupled to the low-side gate terminal and is responsive to low-side commands to cause the conductivity of the low-side transistor to vary. The converter control is configured to supply the high-side control commands and the low-side control commands to the high-side gate driver and the low-side gate driver, respectively. The capacitance divider network includes a first capacitor and a second capacitor. The first capacitor is electrically connected in series, at a DC-link midpoint node, to the second capacitor. The first capacitor is also electrically connected to the positive DC supply terminal, and the second capacitor is electrically connected to the negative DC supply terminal. The first balancing resistor is electrically connected in series, at the DC-link midpoint node, to the second balancing resistor, and is also electrically connected to the positive DC supply terminal. The second balancing resistor is electrically connected to the negative DC supply terminal. The DC-link midpoint node, the gate driver power supply, and the converter control are all electrically connected to, and share, a local electrical ground. The primary winding of the high-side isolation transformer includes a first high-side primary terminal and a second high-side primary terminal. The primary winding of the low-side isolation transformer includes a first low-side primary terminal and a second low-side primary terminal. The first high-side primary terminal and the first low-side primary terminal are both coupled to the gate driver power supply, and the second high-side primary terminal and the second low-side primary terminal are both electrically coupled to a local electrical ground.

Furthermore, other desirable features and characteristics of the DC-DC converter circuit will become apparent from the subsequent detailed description and the appended claims, taken in conjunction with the accompanying drawings and the preceding background.

BRIEF DESCRIPTION OF DRAWINGS

The present disclosure will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Figure 1:
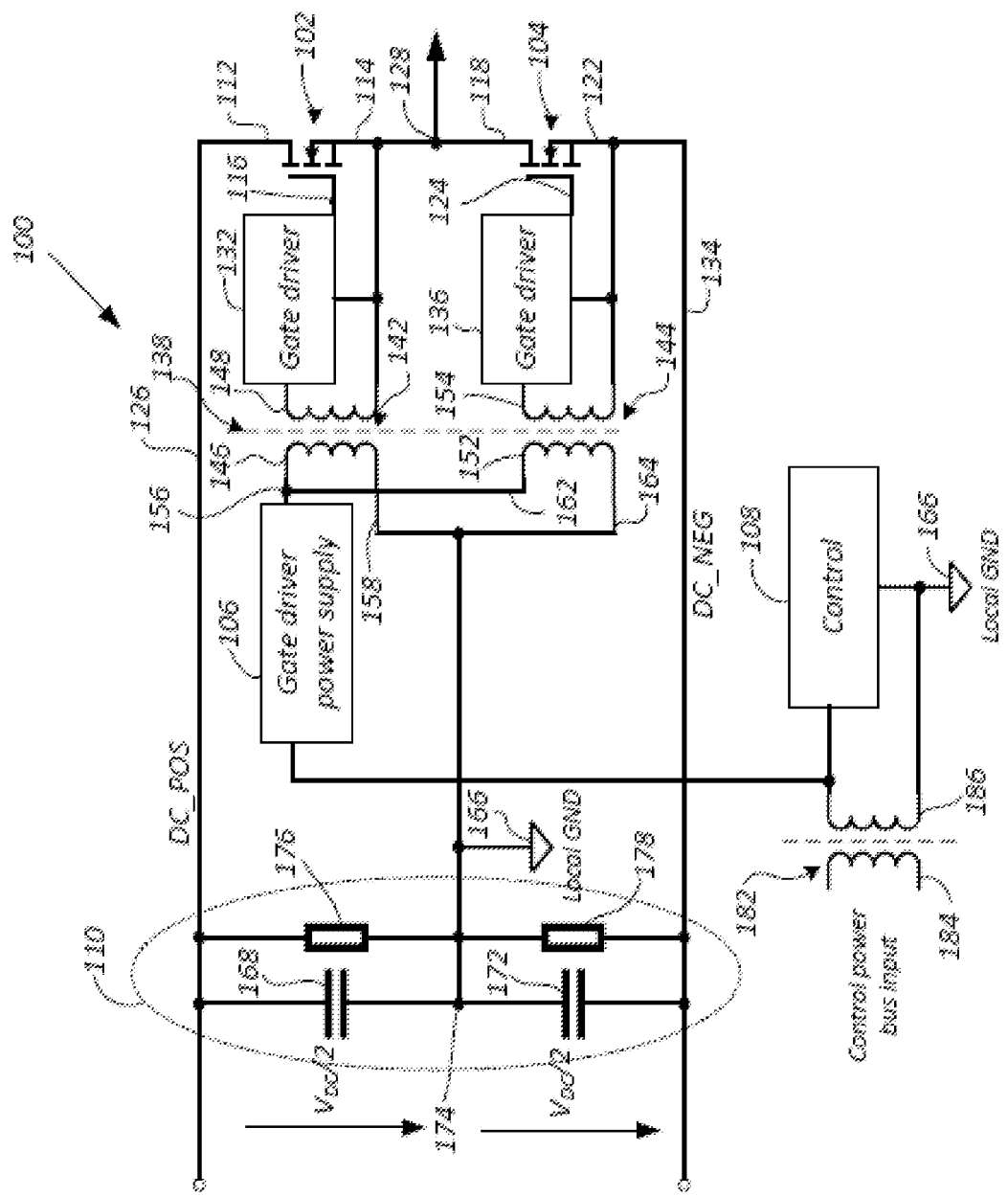
FIG. 1 depicts a functional schematic diagram of one embodiment of a DC-DC converter circuit.

Referring to FIG. 1, a functional block diagram of one embodiment of a DC-DC converter circuit 100 is depicted and includes a high-side transistor 102, a low-side transistor 104, a gate driver power supply 106, a converter control 108, and a capacitance divider network 110. The high-side transistor 102 includes a high-side drain terminal 112, a high-side source terminal 114, and a high-side gate terminal 116. The low-side transistor 104 similarly includes a low-side drain terminal 118, a low-side source terminal 122, and a low-side gate terminal 124.

As FIG. 1 further depicts, the high-side drain terminal 112 is coupled to a positive DC supply terminal 126, the high-side source terminal 114 is coupled to a switching node 128, and the high-side gate terminal 116 is coupled to a high-side gate driver 132. The low-side drain terminal 118 is also coupled to the switching node 128, the low-side source terminal 122 is coupled to a negative DC supply terminal 134, and the low-side gate terminal 124 is coupled to a low-side gate driver 136. Although the high-side and low-side transistors 102, 104 may be variously implemented, in the depicted embodiment each is implemented using a metal-oxide-semiconductor field-effect transistor (MOSFET). More specifically, at least in the depicted embodiment, each is an N-channel, silicon carbide enhancement-mode MOSFET. It will be appreciated that in other embodiments the high-side and low-side transistors 102, 104 may be implemented using, for example, IGBT transistors, thyristors, GaN FETs, or various other semiconductor switching devices, just to name a few.

The gate driver power supply 106 is electrically isolated from the high-side transistor 102 and the low-side transistor 104. To do so, an isolation transformer 138 is coupled between the gate driver power supply 106 and each of the high-side and low-side transistors 102, 104. More specifically, at least in the depicted embodiment, the isolation transformer 138 includes a high-side isolation transformer 142 and a low-side isolation transformer 144. The high-side isolation transformer 142 includes a primary winding 146 and a secondary winding 148, and the secondary winding 148 of the high-side isolation transformer 142 is coupled to the high-side gate driver 132. The low-side isolation transformer 144 also includes a primary winding 152 and a secondary winding 154, and the secondary winding 154 of the low-side isolation transformer 144 is coupled to the low-side gate driver 136.

As FIG. 1 further shows, in the depicted embodiment the primary winding 146 of the high-side isolation transformer 142 includes a first high-side primary terminal 156 and a second high-side primary terminal 158, and the primary winding 152 of the low-side isolation transformer 144 includes a first low-side primary terminal 162 and a second low-side primary terminal 164. The first high-side primary terminal 156 and the first low-side primary terminal 162 are both coupled to the gate driver power supply 106, and the second high-side primary terminal 158 and the second low-side primary terminal 164 are both electrically coupled to a local electrical ground 166.

The converter control 108 is configured to implement known switching control logic to thereby supply high-side control commands and low-side control commands to the high-side transistor 102 and the low-side transistor 104, respectively. More specifically, at least in the depicted embodiment, the converter control 108 supplies the high-side control commands to the high-side gate driver 132 and the low-side control commands to the low-side gate driver 136 via non-illustrated digital isolators. The high-side gate driver 132, which is coupled to the high-side gate terminal 116, is responsive to the high-side control commands to cause the conductivity of the high-side transistor 102 to vary. Similarly, the low-side gate driver 136, which is coupled to the low-side gate terminal 124. Is responsive to the low-side commands to cause the conductivity of the low-side transistor 104 to vary.

The capacitance divider network 110 includes at least a first capacitor 168 and a second capacitor 172. The first capacitor 168 is electrically connected in series, at a DC-link midpoint node 174, to the second capacitor 172. The first capacitor 168 is also electrically connected to the positive DC supply terminal 126, and the second capacitor 172 is also electrically connected to the negative DC supply terminal 134. Thus, as FIG. 1 depicts, the DC-link midpoint node 174, the gate driver power supply 106, and the converter control 108 are all electrically connected to, and share, the local electrical ground 166.

In addition to the first and second capacitors 168, 172, the capacitance divider network 110, at least in the depicted embodiment, additionally includes a first balancing resistor 176 that is electrically connected in series, at the DC-link midpoint node 174, to a second balancing resistor 178. The first balancing resistor 176 is also electrically connected to the positive DC supply terminal 126, and the second balancing resistor 178 is also connected to the negative DC supply terminal 134.

Input power for the gate driver power supply 106 and the converter control 108 is preferably supplied from an input power supply (not depicted in FIG. 1). Preferably, the input power supply is electrically isolated from the gate driver power supply 106 and the converter control 108 via an input transformer 182. The input transformer 182 has a primary winding 184, which is adapted to be coupled to the input power supply, and a secondary winding 186 that is coupled to the gate driver power supply 106, the converter control 108, and the local electrical ground 166.

The DC-DC converter circuit topology disclosed herein significantly reduces (i.e., by 2×) the voltage stress of various components, such as the gate driver power supply isolation transformer and gate driver signal isolators. By connecting the gate driver power supply 106 and the converter control 108 to the DC-link midpoint node 174, and thus the local electrical ground 166, voltage stress across multiple component types is reduced to ½ of the input voltage.

Figure 2:
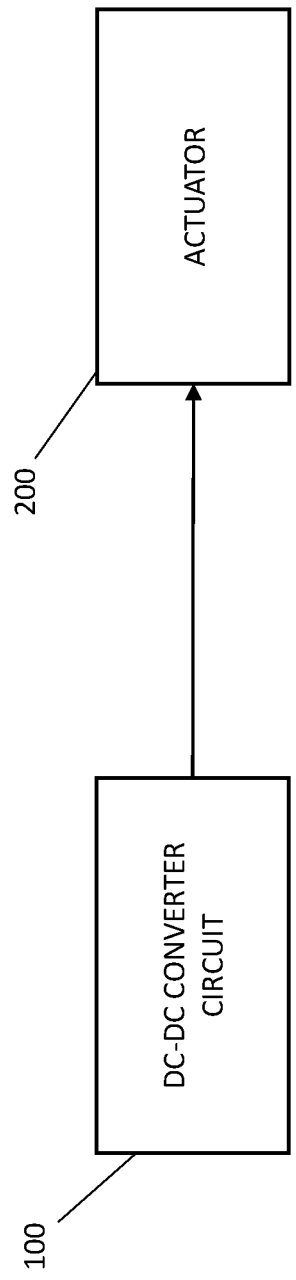
FIGS. 2 and 3 depict functional block diagrams of the DC-DC converter circuit of FIG. 1 supplying DC power to an actuator and an aircraft electronic circuit, respectively.
Figure 3:
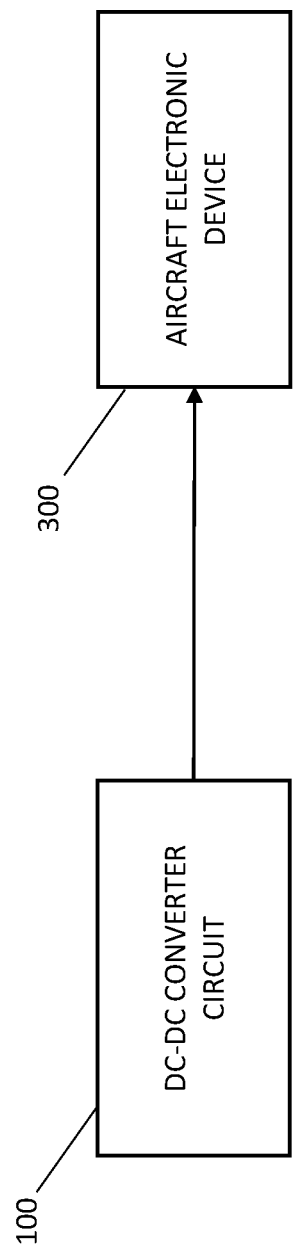

The DC-DC converter circuit 100 can be used to supply DC voltage to numerous and varied DC loads. Two examples of DC loads that the DC-DC converter circuit 100 may supply DC voltage to are depicted in FIGS. 2 and 3, and include an aircraft actuator 200 and an aircraft electronic device 300, respectively.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A DC-DC converter circuit, comprising:
   a high-side transistor including a high-side drain terminal, a high-side source terminal, and a high-side gate terminal, the high-side drain terminal coupled to a positive DC supply terminal;
   a low-side transistor including a low-side drain terminal, a low-side source terminal, and a low-side gate terminal, the low-side drain terminal coupled to the high-side source terminal, the low-side source terminal coupled to a negative DC supply terminal;
   a gate driver power supply electrically isolated from the high-side transistor and the low-side transistor and not directly connected to the positive DC supply terminal or the negative DC supply terminal;
   a converter control configured to supply high-side control commands and low-side control commands to the high-side transistor and the low-side transistor, respectively; and
   a capacitance divider network including a first capacitor and a second capacitor, the first capacitor electrically connected in series, at a DC link midpoint node, to the second capacitor, the first capacitor electrically connected to the positive DC supply terminal, the second capacitor electrically connected to the negative DC supply terminal,
   wherein the DC-link midpoint node, the gate driver power supply, and the converter control are all electrically connected to, and share, a local electrical ground.

2. The circuit of claim 1, wherein the capacitance divider network further includes
   a first balancing resistor electrically connected in series, at the DC-link midpoint node, to a second balancing resistor, the first balancing resistor electrically connected to the positive DC supply terminal, the second balancing resistor electrically connected to the negative DC supply terminal.

3. The circuit of claim 1, further comprising:
   a high-side gate driver coupled to the high-side gate terminal and responsive to the high-side control commands cause the conductivity of the high-side transistor to vary;
   a low-side gate driver coupled to the low-side gate terminal and responsive to the low-side commands to cause the conductivity of the low-side transistor to vary.

4. The circuit of claim 3, further comprising:
   an isolation transformer coupled between the gate driver power supply and each of the high-side and low-side transistors.

5. The circuit of claim 4, wherein the isolation transformer comprises:
a high-side isolation transformer having a primary winding and a secondary winding, the secondary winding of the high-side isolation transformer coupled to the high-side gate driver; and
a low-side isolation transformer having a primary winding and a secondary winding, the secondary winding of the low-side isolation transformer coupled to the low-side gate driver.

6. The circuit of claim 5, wherein:
the primary winding of the high-side isolation transformer includes a first high-side primary terminal and a second high-side primary terminal;
the primary winding of the low-side isolation transformer includes a first low-side primary terminal and a second low-side primary terminal;
the first high-side primary terminal and the first low-side primary terminal are both coupled to the gate driver power supply;
the second high-side primary terminal and the second low-side primary terminal are both electrically coupled to a local electrical ground.

7. The circuit of claim 1, further comprising:
an input transformer having a primary winding and a secondary winding, the primary winding adapted to be coupled to an input power supply, the secondary winding coupled to the gate driver power supply, the converter control, and the local electrical ground.

8. The circuit of claim 1, further comprising an actuator coupled to receive electric power from the DC-DC converter circuit.

9. The circuit of claim 1, further comprising an aircraft electronic device coupled to receive electric power from the DC-DC converter circuit.

10. A DC-DC converter circuit, comprising:
a high-side transistor including a high-side drain terminal, a high-side source terminal, and a high-side gate terminal, the high-side drain terminal coupled to a positive DC supply terminal;
a low-side transistor including a low-side drain terminal, a low-side source terminal, and a low-side gate terminal, the low-side drain terminal coupled to the high-side source terminal, the low-side source terminal coupled to a negative DC supply terminal;
a gate driver power supply electrically isolated from the high-side transistor and the low-side transistor and not directly connected to the positive DC supply terminal or the negative DC supply terminal;
a high-side gate driver coupled to the high-side gate terminal and responsive to high-side control commands to cause the conductivity of the high-side transistor to vary;
a low-side gate driver coupled to the low-side gate terminal and responsive to low-side commands to cause the conductivity of the low-side transistor to vary;
a converter control configured to supply the high-side control commands and the low-side control commands to the high-side gate driver and the low-side gate driver, respectively;
a capacitance divider network including a first capacitor and a second capacitor, the first capacitor electrically connected in series, at a DC-link midpoint node, to the second capacitor, the first capacitor electrically connected to the positive DC supply terminal, the second capacitor electrically connected to the negative DC supply terminal;
a first balancing resistor electrically connected in series, at the DC-link midpoint node, to a second balancing resistor, the first balancing resistor electrically connected to the positive DC supply terminal, the second balancing resistor electrically connected to the negative DC supply terminal;
wherein the DC-link midpoint node, the gate driver power supply, and the converter control are all electrically connected to, and share, a local electrical ground.

11. The circuit of claim 10, further comprising:
an isolation transformer coupled between the gate driver power supply and each of the high-side and low-side transistors.

12. The circuit of claim 11, wherein the isolation transformer comprises:
a high-side isolation transformer having a primary winding and a secondary winding, the secondary winding of the high-side isolation transformer coupled to the high-side gate driver; and
a low-side isolation transformer having a primary winding and a secondary winding, the secondary winding of the low-side isolation transformer coupled to the low-side gate driver.

13. The circuit of claim 12, wherein:
the primary winding of the high-side isolation transformer includes a first high-side primary terminal and a second high-side primary terminal;
the primary winding of the low-side isolation transformer includes a first low-side primary terminal and a second low-side primary terminal;
the first high-side primary terminal and the first low-side primary terminal are both coupled to the gate driver power supply;
the second high-side primary terminal and the second low-side primary terminal are both electrically coupled to a local electrical ground.

14. The circuit of claim 10, further comprising:
an input transformer having a primary winding and a secondary winding, the primary winding adapted to be coupled to an input power supply, the secondary winding coupled to the gate driver power supply, the converter control, and the local electrical ground.

15. The circuit of claim 10, wherein the high-side transistor and the low-side transistor are each MOSFETs.

16. The circuit of claim 15, wherein the high-side transistor and the low-side transistor are each N-channel, silicon carbide enhancement-mode MOSFETs.

17. A DC-DC converter circuit, comprising:
a high-side transistor including a high-side drain terminal, a high-side source terminal, and a high-side gate terminal, the high-side drain terminal coupled to a positive DC supply terminal;
a low-side transistor including a low-side drain terminal, a low-side source terminal, and a low-side gate terminal, the low-side drain terminal coupled to the high-side source terminal, the low-side source terminal coupled to a negative DC supply terminal;
a gate driver power supply;
an isolation transformer coupled between the gate driver power supply and each of the high-side and low-side transistors, the isolation transformer including a high-side isolation transformer and a low-side isolation transformer, the high-side isolation transformer having a primary winding and a secondary winding, the secondary winding of the high-side isolation transformer coupled to the high-side gate driver, the low-side isolation transformer having a primary winding and a secondary winding, the secondary winding of the low-side isolation transformer coupled to the low-side gate driver;
a high-side gate driver coupled to the high-side gate terminal and responsive to high-side control commands to cause the conductivity of the high-side transistor to vary;
a low-side gate driver coupled to the low-side gate terminal and responsive to low-side commands to cause the conductivity of the low-side transistor to vary;
a converter control configured to supply the high-side control commands and the low-side control commands to the high-side gate driver and the low-side gate driver, respectively;
a capacitance divider network including a first capacitor and a second capacitor, the first capacitor electrically connected in series, at a DC-link midpoint node, to the second capacitor, the first capacitor electrically connected to the positive DC supply terminal, the second capacitor electrically connected to the negative DC supply terminal;
a first balancing resistor electrically connected in series, at the DC-link midpoint node, to a second balancing resistor, the first balancing resistor electrically connected to the positive DC supply terminal, the second balancing resistor electrically connected to the negative DC supply terminal, wherein:
the DC-link midpoint node, the gate driver power supply, and the converter control are all electrically connected to, and share, a local electrical ground,
the primary winding of the high-side isolation transformer includes a first high-side primary terminal and a second high-side primary terminal,
the primary winding of the low-side isolation transformer includes a first low-side primary terminal and a second low-side primary terminal,
the first high-side primary terminal and the first low-side primary terminal are both coupled to the gate driver power supply, and
the second high-side primary terminal and the second low-side primary terminal are both electrically coupled to a local electrical ground.

18. The circuit of claim 17, further comprising:
an input transformer having a primary winding and a secondary winding, the primary winding adapted to be coupled to an input power supply, the secondary winding coupled to the gate driver power supply, the converter control, and the local electrical ground.

19. The circuit of claim 17, wherein the high-side transistor and the low-side transistor are each MOSFETs.

20. The circuit of claim 19, wherein the high-side transistor and the low-side transistor are each N-channel, silicon carbide enhancement-mode MOSFETs.

* * * * *